United States Patent
Schriever

(10) Patent No.: US 8,147,647 B2
(45) Date of Patent: Apr. 3, 2012

(54) METHOD AND ARRANGEMENT FOR CLEANING OPTICAL SURFACES IN PLASMA-BASED RADIATION SOURCES

(75) Inventor: Guido Schriever, Goettingen (DE)

(73) Assignee: XTREME technologies GmbH, Jena (DE)

( * ) Notice: Subject to any disclaimer, the term of this patent is extended or adjusted under 35 U.S.C. 154(b) by 365 days.

(21) Appl. No.: 12/128,784

(22) Filed: May 29, 2008

(65) Prior Publication Data

US 2009/0014027 A1  Jan. 15, 2009

(30) Foreign Application Priority Data

Jul. 14, 2007  (DE) .......................... 10 2007 033 701

(51) Int. Cl.
   *C23F 1/00* (2006.01)
   *H01L 21/306* (2006.01)
   *C25F 5/00* (2006.01)

(52) U.S. Cl. ........................ 156/345.43; 134/1.1; 216/67

(58) Field of Classification Search ............. 156/345.43, 156/345.44, 345.45, 345.46, 345.47
   See application file for complete search history.

(56) References Cited

U.S. PATENT DOCUMENTS

| | | | |
|---|---|---|---|
| 6,968,850 B2 | 11/2005 | Chan et al. | |
| 2001/0002244 A1* | 5/2001 | Gieshoff et al. | 423/235 |
| 2004/0011381 A1 | 1/2004 | Klebanoff et al. | |
| 2005/0161433 A1* | 7/2005 | Silberberg et al. | 216/67 |
| 2006/0000489 A1 | 1/2006 | Chan et al. | |
| 2007/0062557 A1 | 3/2007 | Rakhimova et al. | |
| 2007/0131878 A1* | 6/2007 | Banine et al. | 250/492.2 |

FOREIGN PATENT DOCUMENTS

| | | |
|---|---|---|
| DE | 195 32 105 | 3/1996 |
| DE | 197 17 698 | 10/1998 |
| DE | 102 57 344 | 7/2004 |
| WO | 2004/104707 | 12/2004 |
| WO | 2005/101122 | 10/2005 |
| WO | 2006/136967 | 12/2006 |

OTHER PUBLICATIONS

*J. Vac. Sci. Technol.* A 13(4) (Jul./Aug. 1995), pp. 2074-2085 "Characterization of a slot antenna microwave plasma source for hydrogen plasma cleaning" D. Korzec, et al.

* cited by examiner

*Primary Examiner* — Maureen Gramaglia
(74) *Attorney, Agent, or Firm* — Frommer Lawrence & Haug LLP

(57) ABSTRACT

The invention is directed to a method and an arrangement for cleaning optical surfaces of reflection optics which are arranged in a plasma-based radiation source or exposure device arranged downstream and contaminated by debris particles emitted by a hot plasma of the radiation source. It is the object of the invention to find a novel possibility for in-situ cleaning of the optical surfaces of reflection optics which are contaminated by debris in plasma-based radiation sources so as to allow an integrated generation of known gas radicals and the isotropic distribution thereof on the contaminated optical surfaces. According to the invention, this object is met in that the gas radicals are generated by dielectrically impeded discharge between two surface electrodes along the entire optical surface. The gas radicals are generated almost exclusively by electron transfer on at least one barrier layer which covers the entire surface of at least one of the surface electrodes, an AC voltage in the Hz to kHz range is applied to the surface electrodes for periodically eliminating the charge polarization at the barrier layer so that a cold plasma is generated continuously and the deposited debris particles are removed as gaseous reaction products by the gas flow guided over the optical surface.

21 Claims, 3 Drawing Sheets

METHOD AND ARRANGEMENT FOR CLEANING OPTICAL SURFACES IN PLASMA-BASED RADIATION SOURCES

CROSS-REFERENCE TO RELATED APPLICATION

This application claims priority of German Application No. 10 2007 033 701.0, filed Jul. 14, 2007, the complete disclosure of which is hereby incorporated by reference.

BACKGROUND OF THE INVENTION a) Field of the Invention

The invention is directed to a method and an arrangement for cleaning optical surfaces of reflection optics which are contaminated in a lithographic exposure device by debris emitted by a hot plasma of a plasma-based EUV radiation source, particularly of collector optics in extreme ultraviolet (EUV) high-power radiation sources for semiconductor lithography.

b) Description of the Related Art

EUV radiation is usually generated by thermal radiation sources, particularly by the generation of dense, hot plasmas which are typically based on laser-produced plasma (LPP) or gas-discharge plasma (GDP) and emit isotropically in space. Therefore, for application of EUV radiation, collecting optics are arranged near the source to bundle the emitted radiation from the largest possible solid angle.

A characteristic feature of any plasma-based radiation source is that, in addition to the desired short-wavelength radiation, fast ions or neutral particles are also emitted from the plasma in all directions. These particles (debris) are damaging primarily to the collector optics and condenser optics near the plasma which are constructed for the EUV range as reflection optics with sensitive surfaces, whether they are normal-incidence multilayer mirrors or grazing-incidence metal mirrors. In either case, the surfaces are degraded by the impinging debris, above all in that debris particles are deposited on the surface and reduce reflectivity.

Aside from xenon, it has become increasingly common to use tin or lithium as a working medium in high-power radiation sources for EUV semiconductor lithography because they achieve a higher efficiency of energy conversion in the wavelength range around 13.5 nm. Tin vapor, lithium vapor or eroded electrode materials (e.g., tungsten or molybdenum) which are generated at the source or in its immediate surroundings condense on the relatively cool surfaces of the optics and are deposited there as layers. Deposits of this kind alter the surface characteristics and reduce the reflectivity of the optics relatively quickly.

Cleaning methods using reactive gases or gas radicals are known in the prior art for removing deposits on EUV optics. For example, US 2004/011381 A1 describes the cleaning of optics contaminated by carbons and hydrocarbons by means of atomic hydrogen especially for multilayer optics. The free hydrogens are generated within a closed, cooled housing by flowing through hot filaments and are directed to the optics as a flow of gas. The description refers to an in-situ cleaning, but this can scarcely be implemented in EUV sources for semiconductor lithography simply for space considerations, as the space in front of (normal-incidence) multilayer optics is reserved for generating the EUV-emitting plasma.

Further, for cleaning light source collector optics for grazing incidence, U.S. Pat. No. 6,968,850 B2 discloses the elimination of a tungsten coating of eroded electrode material through free fluorine in that the collector optics in the shape of an ellipse of rotation are divided into sections (e.g., half-shells) to which different potentials are applied in order to generate a plasma from the fluorine gas introduced therebetween by microwave excitation or HF excitation, the plasma forming gaseous compounds with the eroded electrode material (tungsten) which can then simply be pumped off.

Glowing filaments are often used to regenerate reactive gases for thermal splitting of the molecules of a gas (e.g., hydrogen). For example, US 2004/011381 A1 describes a method for cleaning optics with hydrogen especially for Mo/Si multilayer optics in which atomic hydrogen is directed to the optical surface. The device indicated for this purpose for generating the flow of hydrogen resembles a cooled blow dryer in which molecular hydrogen is introduced on the input side and activated by a heated filament grid so as to be expelled on the output side. However, the hot filaments are disadvantageous in that they must likewise be replaced at regular intervals and even cause contamination through evaporation. Further, the spatial distribution of the reagents is inhomogeneous in small filaments and there is scant possibility of integrating large-surface (close-meshed) filaments in the optical systems of an EUV source without substantial radiation shadows because collector optics must usually occupy an entire half-space around a virtually punctiform plasma to achieve the highest possible efficiency in beam bundling.

Further, US 2006/0000489 A1 discloses microwave plasmas or HF plasmas for generating free fluorines or fluorocarbons, wherein free hydrogen or free oxygen must then be generated to eliminate the reaction products of the fluorine-containing radicals. The free hydrogens or free oxygens are likewise formed either through microwave excitation or HF excitation or also through the interaction of corresponding molecules with fluoro-plasma. There remains the difficulty of generating the radicals with sufficient uniformity that they reach every location of a nested optical system.

An arrangement for improving the homogeneity of a flowing plasma and the efficiency of the coupling-in of energy was described by D. Korzec, et al. in "Characterization of a slot antenna microwave plasma source for hydrogen plasma cleaning", *J. Vac. Sci. Technol.* A 13, 4 (1995) 2074-2085. For this purpose, a hydrogen plasma is generated in that microwave energy is coupled from the periphery into an internal, cylindrical quartz tube through which gas flows longitudinally by an annular waveguide through an inwardly directed slot antenna system (SLAN). To this end, a standing electromagnetic wave is generated in the annular waveguide and the antenna slots are arranged in the inner wall of the annular waveguide at its wave nodes in order to achieve a maximum, evenly distributed coupling in of the microwave energy. The drawback in this case is the spatially determined, compact construction that prevents integration into a plasma-based EUV source.

Further, it is known from WO 2005/101122 A1 for the removal of carbon-containing deposits that are deposited on a multilayer mirror during the generation of EUV radiation to generate volatile carbon compounds through chemical reactions with nitrogen or halogens which can then be removed by suction. This solution, which is described only for discharge plasmas of $O_2$ and $H_2$, has the drawback that the latter are only usable ex situ for optical systems which are contaminated in EUV radiation sources.

US 2007/0062557 A1 discloses an electric discharge generator for cleaning an optical element of a lithographic exposure device. In one variant, the discharge generator is integrated directly in the collector mirror by arranging a plurality of current-carrying coils around the outer sides of a plurality of nested, rotationally symmetric reflectors of the collector mirror in order to generate by induction a high-frequency discharge in the gas between the individual mirror shells. In a modified construction, the rotationally symmetric reflectors are provided with conducting plates on their outer sides. Oppositely located conducting plates of neighboring reflectors are insulated from one another and high voltage is applied to them by the discharge generator in order to generate a great number of capacitive discharges between a plurality of oppositely located conducting plates of neighboring reflector shells. The disadvantage in this solution is that fast electrons as well as fast ions are generated in the gas that flows through and, as a result of the electric and/or magnetic field effect, are accelerated to the nested metal reflector shells so that the generated plasma causes thermal stress on the reflector surfaces and additional unwanted sputtering effects result from the accelerated ions.

OBJECT AND SUMMARY OF THE INVENTION

It is the primary object of the invention to find a novel possibility for in-situ cleaning of the optical surfaces of reflection optics which are contaminated by the debris emitted by a hot plasma in a plasma-based EUV radiation source so as to allow an integrated generation of known gas radicals and the isotropic distribution thereof on the contaminated optics surfaces without increasing the space requirement due to the integrated generation of the gas radicals and without high thermal stress on the optics surfaces.

According to the invention, the method for cleaning optical surfaces of reflection optics, which are arranged in plasma-based radiation sources or exposure devices arranged downstream and which are contaminated by debris particles emitted by a hot plasma of the radiation source, in which at least one gas which is reactive for the debris particles is guided over the optical surface, gas radicals are generated by electrical discharges over the optical surface, debris particles deposited on the optical surface are bonded by the gas radicals to form gaseous reaction products, and the reaction products are carried away from the optical surface by the gas flow, is characterized in that the gas radicals are generated by dielectrically impeded discharge between two surface electrodes which are arranged along the entire closed optical surface and approximately parallel over the optical surface, wherein the gas radicals are generated almost exclusively by electron transfer by charge polarization on at least one dielectric barrier layer which covers the entire surface of at least one of the surface electrodes, an AC voltage in the Hz to kHz range is applied to the surface electrodes for periodically eliminating the charge polarization at the barrier layer so that a homogeneous cold plasma is generated continuously from the gas flowing in, the gas radicals of this homogeneous cold plasma can absorb substantially no kinetic energy during the dielectrically impeded discharge, and the cold plasma is guided over the optical surface with the flow of gas without thermal stress or sputtering on the optical surface in order to bond the deposited debris particles and suck them up through a vacuum system as gaseous reaction products.

The dielectrically impeded discharge is advisably generated between neighboring nested mirror surfaces of collector optics, and the barrier layer is arranged in each instance on the non-reflecting outer side of the respective mirror surface, and the discharge is carried out for the innermost mirror surface by means of a center electrode that is coated by a barrier layer.

However, the dielectrically impeded discharge can also advisably be used with normal-incidence multilayer mirrors by generating dielectrically impeded discharges between a metallic rear coating of a multilayer mirror and a grid electrode that is formed parallel over the optical surface and, in case the multilayer mirror has a system of dielectric alternating layers, the latter is used as a barrier layer.

If this is not the case, the dielectrically impeded discharges are generated between the metallic rear coating and the grid electrode that is formed parallel to the optical surface in that the grid electrode is provided with a dielectric barrier layer.

By streaming in hydrogen, the dielectrically impeded discharge is preferably used for removing metallic deposits from the group of lithium, tin, and carbon-containing, nitrogen-containing and oxygen-containing components from optical surfaces. Further, dielectrically impeded discharges can advantageously be used accompanied by introduction of fluorine for removing tungsten or molybdenum from the optical surfaces, wherein volatile reaction products (e.g., $MoF_6$ or $WF_6$) are generated. Metals deposited on optical surfaces can likewise be converted to volatile reaction products (e.g., $WBr_3$, melting point 80° C.) by using other halogens (chlorine, bromine, iodine). Further, oxygen can be used to clean off carbon-containing compounds by generating gaseous CO or $CO_2$. A number of reactions can take place simultaneously by using gas mixtures.

The above-stated object is further met in an arrangement for cleaning optical surfaces of reflection optics which are arranged in a plasma-based radiation source or in an exposure device arranged downstream and which are contaminated by debris particles emitted by a hot plasma of the radiation source, wherein gas feeds are arranged at the edge of the optical surfaces for streaming in at least one gas along the optical surfaces, which gas is reactive for the debris particles, and gas radicals can be generated from the introduced gas by means of electric discharges with the participation of electrode areas that are associated with at least a portion of the optical surface in parallel planes, these gas radicals forming gaseous compounds with debris particles generated by plasma, and vacuum pumps are provided in the radiation source for sucking up these debris particles, characterized in that a closed optical surface is formed in each instance either itself as a surface electrode or is provided with a back surface electrode parallel to the optical surface, in that a surface electrode that is formed approximately parallel to the optical surface is arranged over the optical surface as a counter-electrode, in that at least one dielectric barrier layer is arranged between the surface electrodes on one of the oppositely located surface electrodes so as to cover the entire surface, and in that the oppositely located surface electrodes are connected to an AC voltage source having an AC voltage in the Hz to kHz range so that a cold plasma is generated in the gas flow between the surface electrodes by ongoing dielectrically impeded discharges which are evenly distributed spatially and gas radicals are continuously provided for cleaning the optical surfaces.

The AC voltage source is advisably adjustable to a frequency in the range between 1 Hz and 100 kHz.

The invention is advantageously realized in collector optics which are constructed for grazing incidence and which have nested mirror surfaces in that adjacent metal mirror surfaces are formed in each instance as surface electrodes which are connected to different poles of the AC voltage source, wherein the barrier layer is arranged on the non-reflecting rear side of the respective mirror surface and a center electrode coated with a barrier layer is provided for the innermost mirror surface.

The nested mirror surfaces serving as oppositely located surface electrodes and the center electrode are preferably connected alternately from the outside inward to different poles of the same AC voltage source in order to ensure their opposite charging. But they can also be alternately connected to different AC voltage sources, in which case the latter must have opposing phase positions with respect to one another.

The AC voltage applied to the surface electrodes is advantageously between several tens of volts and a few kilovolts depending on the spacing of the mirror surfaces and the characteristics of the barrier layer.

The barrier layer advisably has a thickness of between 0.1 µm and a few millimeters.

The barrier layer is preferably made of plastic (e.g., Mylar), glass or ceramic (e.g., $Al_2O_3$). In addition to the electrical characteristics (dielectricity), the vacuum compatibility (low porosity, low outgassing, and so on) must also be ensured for the present application.

Further, the invention can also be applied in collector optics which are formed as a multilayer mirror for normal incidence in that a metal, back electrode and a grid electrode which is formed parallel to the optical surface and arranged at a defined distance in front of the latter are connected to the AC voltage source as surface electrodes.

The grid electrode is advisably constructed as a thin wire grid with a mesh opening that is small in relation to the distance to the optical surface and a wire cross section of less than 500 µm (least possible geometric shadowing, but still mechanically stable) and is preferably made of a metal with good electric conductivity (e.g., copper, silver, gold).

The grid electrode is advantageously provided with a dielectric coating over its entire surface for realizing the barrier layer.

When the mirror surface of the multilayer mirror is constructed as a dielectric alternating layer system, the latter can itself be used as a barrier layer.

In another construction of a multilayer mirror that has no dielectric alternating layer system, the mirror surface of the multilayer mirror is provided with a dielectric cover layer that is transparent to EUV radiation as barrier layer (22).

The basic idea behind the invention is that it is disadvantageous to generate the reactive gases (gas radicals for chemically bonding unwanted debris deposits) outside the radiation source or outside the lithographic exposure apparatus because recombination processes take place already within the relatively long feed lines, the feed lines cause unwanted shadowing of the radiation, and it is virtually impossible to introduce the ionized gas in a homogeneous manner. Further, thermal and/or contaminating damage to the optical surfaces above all cannot be prevented in known arrangements for cleaning nested reflection optics which generate a hot plasma directly above the optical surfaces based on microwaves, inductance or capacitance.

The invention solves these conflicting problems through the generation of a "cold plasma" based on dielectrically impeded discharges in which dielectrically coated electrode surfaces are integrated in the optics to be cleaned. On the one hand, if nested metal reflectors are provided, two neighboring reflectors are used as surface electrodes to which AC voltage is applied and between which a dielectric layer is arranged on the non-reflecting rear side of a surface electrode. On the other hand, if a single-shell multilayer mirror (e.g., Mo/Si multilayer mirror) is provided, a back electrode and a front grid electrode are used for the dielectrically impeded discharge. The integration of the dielectrically impeded discharges in nested collector optics has proven particularly advantageous because the gas radicals are generated in close proximity to the reflection surfaces to be cleaned in that a suitable gas is streamed into the spaces between the nested collectors and a homogeneous cold plasma is formed by dielectrically impeded discharges. Since substantially only electrons take on the charge transfer in dielectrically impeded discharges, the gas ions (gas radicals) hardly absorb thermal energy and therefore do not trigger secondary sputtering effects.

The advantages in using a "cold" plasma generated by dielectrically impeded discharges for cleaning the optic surfaces compared to a "hot" plasma generated by microwaves, induction or capacitance consist in the reduced thermal stress on the optics. Further, the discharge processes are substantially shorter because only electrons are transferred so that— due to the smaller mass of the electrons compared to the gas ions—there is also a substantially reduced tendency toward sputtering due to the discharge ionization on the surface of the optics. Further, the cleaning can be carried out (in situ) on any optics installed inside the radiation source or lithographic exposure device arranged downstream. Therefore, the surface quality of the optics can be maintained over longer periods of time without having to dismantle the optics for cleaning.

The invention makes it possible to clean the optical surfaces of reflection optics that are contaminated in a lithographic exposure device by debris emitted by a hot plasma in a plasma-based EUV radiation source, to realize an in-situ cleaning process that permits an integrated generation of known gas radicals and the homogeneous distribution thereof on the vulnerable optic surfaces without having to accept an added space requirement for the integrated generation of the gas radicals or high thermal stresses on the optic surfaces.

The invention will be described more fully in the following with reference to embodiment examples.

DESCRIPTION OF THE PREFERRED EMBODIMENTS

Figure 1:
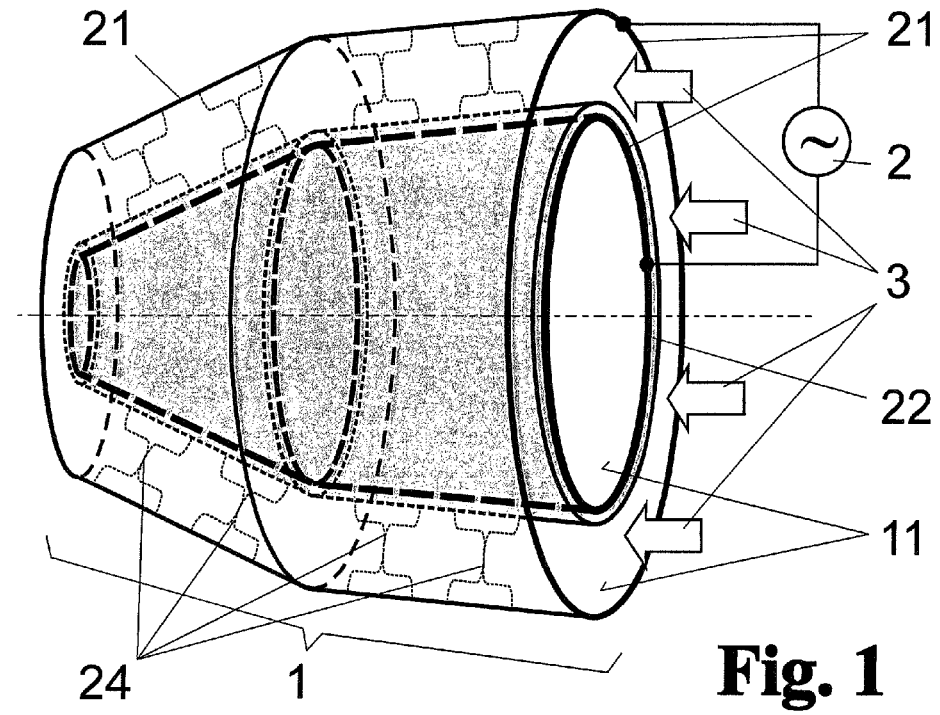
FIG. 1 shows the principle of the arrangement according to the invention for a dielectrically impeded discharge with reference to a radiation collector with two nested metal reflectors for grazing incidence.

As is shown schematically in FIG. 1 for a nested, grazing-incidence collector 1, an arrangement for cleaning the optical surfaces of reflection optics which are contaminated in a lithographic exposure device by debris emitted by a hot plasma in a plasma-based EUV radiation source is basically formed of two rotationally symmetric, collinearly arranged mirror surfaces 11 which form metal surface electrodes 21 at the same time and are connected, as such, to an AC voltage source 2. A dielectric barrier layer 22 which is arranged to the rear of the mirror surface 11—because the mirror surfaces 11 to be kept clear are on the inner side of the rotationally symmetric surface electrodes 21—is arranged between the two surface electrodes 21. Accordingly, a dielectrically impeded discharge is possible between the two surface electrodes 21 when voltage is applied.

The dielectrically impeded discharge, which was already described by Werner von Siemens in 1857 as a "silent electrical discharge", works according to the following principle in this specific example (under vacuum conditions in an EUV radiation source): The metal electrodes which are separated by a vacuum path through which gas flows are additionally electrically insulated by at least one dielectric barrier layer 22 which leads to the following modifications of a (purely capacitive) electrical gas discharge:

- The discharge occurs either in the form of many discharge filaments (microdischarge channels) 24 as is shown in FIG. 1 for graphical reasons or as a homogeneous discharge (not shown). In case of a homogeneous discharge, a kind of haze is observed which extends over the entire discharge volume between the surface electrodes 21.
- Electrons are transferred almost exclusively. Therefore, the duration of a discharge is only in the range of nanoseconds because the transporting of ions is substantially suppressed.
- A "cold" plasma is produced because the gas temperature is decisively determined by the ion temperature (of the gas radicals 41) which hardly increases because of the near exclusivity of the electron charge transfer (see FIG. 2).
- The charge transfer stops as soon as the dielectric barrier layer 22 is saturated by electrical charges.
- Because of the saturation of the barrier layer 22 by electrical charges, an AC voltage source 2 must be connected to the surface electrodes 21 to generate a stationary cold plasma and a continuous gas flow 3 must be ensured between the surface electrodes 21 to ensure a continuous discharge process. Any geometric configurations of nested mirror surfaces 11 can be filled up homogeneously with the cold plasma 4 without modifying the original shape of the mirror surfaces 11.

Figure 2:
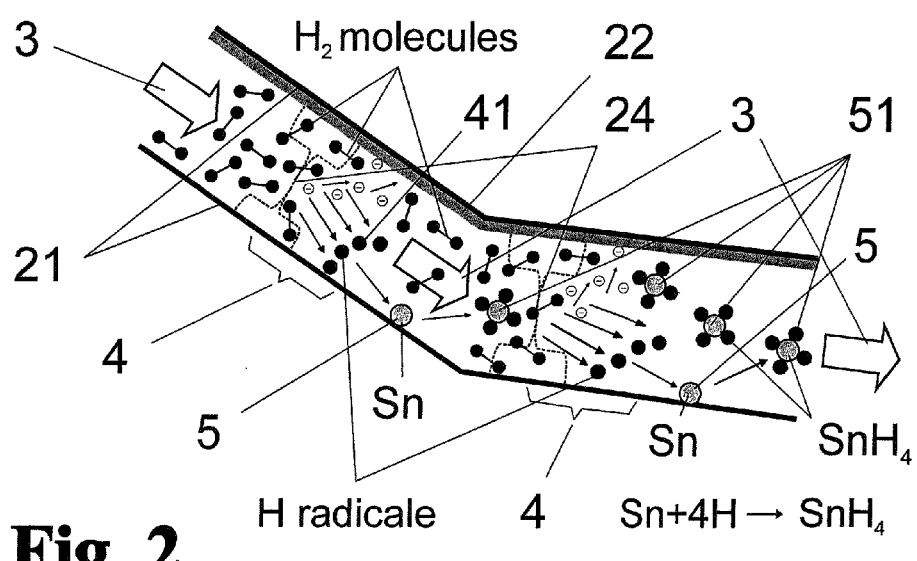
FIG. 2 shows a schematic view of the cleaning mechanism referring to the example of contamination by tin through the introduction of hydrogen and formation of radicals (ionization) through discharge filaments.

FIG. 2 shows the schematic process sequence of the in-situ cleaning of a contaminated optical surface (mirror surface 11) in a section from FIG. 1 by generating the gas radicals 41 in the immediate vicinity of the mirror surface 11.

Without limiting generality, the generation of free hydrogens is shown here specifically for cleaning tin from the mirror surface 11. However, the physical-chemical process described in the following takes place in a completely analogous manner for all other types of gas such as, e.g., halogens (fluorine, chlorine, bromine, iodine, etc.) Useful for eliminating other debris deposits (e.g., lithium, tungsten, molybdenum, carbon-containing, nitrogen-containing and oxygen containing components, etc.).

Hydrogen ($H_2$) is introduced between the surface electrodes 21, one of which is coated on its "inner side" with respect to the flow channel (outer side or rear side of the mirror surface 11 lying inside) with a barrier layer 22 of ceramic ($Al_2O_3$). The $H_2$ molecules are split into free hydrogens by the dielectrically impeded discharge—shown by discharge filaments 24—which immediately form a chemical bond with debris particles 5 (tin-Sn) deposited on the mirror surface 11 and accordingly convert these debris particles 5 into a gaseous reaction product 5 ($SnH_4$) which is removed by the gas flow 3 (possibly with residual gas radicals 41) generated by vacuum suction. Since the collector optics 1 are usually located in a vacuum chamber (not shown), the gas flow 3 is sucked up at the end of the collector optics 1 advisably by means of existing vacuum pumps of the radiation source (not shown).

Due to the dielectrically impeded discharge (also known as "silent discharge") which takes place only over a duration in the nanosecond range because of the rapid saturation of the barrier layer 22, only electrons—because of their lower mass—are sufficiently accelerated for the charge transfer, while the H radicals can hardly absorb any kinetic energy. As a result, a so-called "cold plasma" is formed which achieves an optimal cleaning of the mirror surfaces 11 without generating high thermal energy input or sputtering defects in the mirror surfaces 11 as secondary effects.

Figure 3:
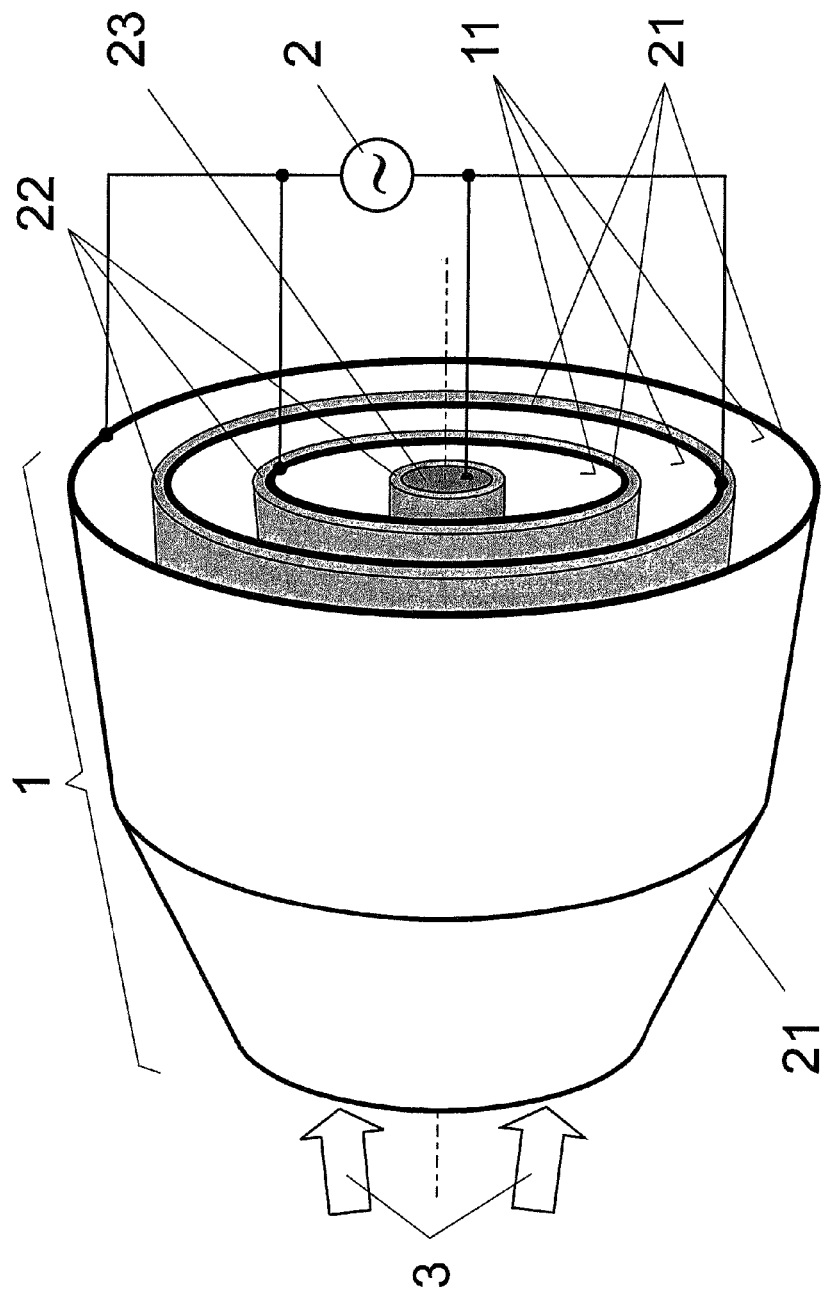
FIG. 3 shows a construction of a collector for dielectrically impeded discharges in three nested reflectors and a center electrode.

Nested collector optics 1 constructed with three reflectors as two-shelled mirror surfaces 11 for grazing-incidence bundling of divergent radiation is shown in FIG. 3 to clarify the schema for connecting a plurality of surface electrodes 21 and a center electrode 23 to the AC voltage source 2.

Because of the almost identical distances of the mirror surfaces 11 relative to one another, all of the dielectrically impeded discharges between the individual surface electrodes 21 themselves and between the innermost surface electrode 21 and the center electrode 23 can be supplied by the same AC voltage source 2 without requiring a higher voltage. Differences in the spacing between the individual mirror surfaces 11 are compensated by suitably dimensioned voltage splitters (not shown).

At values between 1 Hz and 100 kHz, the frequency selected for canceling the saturation of the barrier layer 22 is appreciably lower compared to HF ionization of the gas. Depending on the selected geometry of the electrodes and material of the barrier layer, the required voltage is in the range of several tens of volts to a few kilovolts. As is shown, the introduction of gas into the intermediate spaces between the mirror surfaces 11 can be carried out from the input side of the collector optics 1 or in the opposite direction.

In general, the optics cleaning based on dielectrically impeded discharges can be applied for both grazing-incidence optics and normal-incidence optics.

Figure 4:
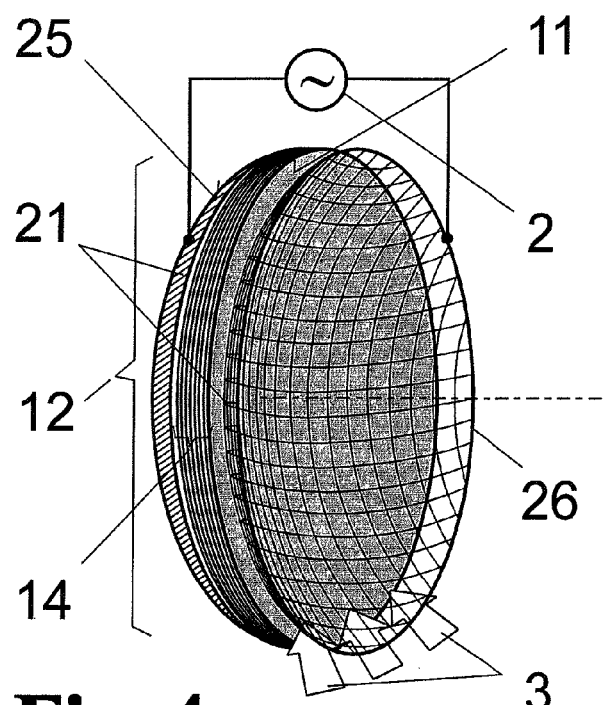
FIG. 4 shows a construction of the invention with a multilayer mirror for normal incidence of radiation having a dielectric alternating layer system, with a back surface electrode, a front grid electrode, and using the dielectric alternating layer system as a barrier layer.
Figure 5:
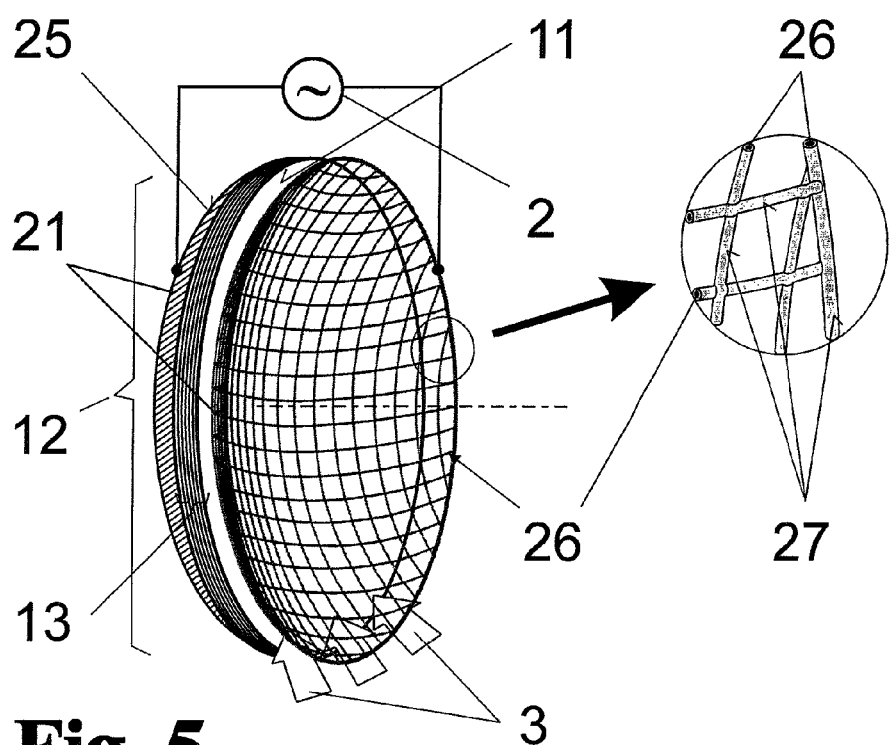
FIG. 5 shows a construction of the invention with a multilayer mirror for normal incidence of radiation having no dielectric alternating layer system, with a back surface electrode and a front grid electrode having a dielectric coating.

An arrangement for eliminating debris deposits in plasma-based EUV radiation sources on normal-incidence optics which are generally formed as a multilayer mirror 12 and outfitted with an alternating layer system 13 and 14 can—as is shown in FIG. 4 and FIG. 5—be constructed also to be very compact and implemented by means of rotationally symmetric, parallel surface electrodes 21. However, at least one of the surface electrodes 21 must be additionally installed in this case.

One of the surface electrodes 21 is realized through the use of a metal substrate or through additional metal coating of a common nonmetal substrate of the multilayer mirror 12 as back electrode 25.

A counter-electrode which absorbs as little EUV radiation as possible must be arranged above the optical surface of the multilayer mirror 12 (mirror surface 11) as a second surface electrode 21. To this end, a grid electrode 26 is shaped analogous to the surface of the multilayer mirror 12 and is arranged at a suitable distance (several tenths of a millimeter to a few centimeters) above the multilayer mirror 12.

The grid electrode 26 is a wire grid of metal wire with a thickness of several hundred micrometers and with a mesh opening of approximately one tenth of the distance to the back electrode 25 (this corresponds to a mesh opening of approximately 1 to 10 mm). Metals with good electrical conductivity (e.g., copper, silver, gold) are used as the material for the grid electrode in order to achieve the smallest possible wire cross sections accompanied by sufficient mechanical stability. However, it can also be useful because of high stress resulting from the close proximity of the radiation-generating plasma to produce the grid electrode 26 from steel wire (preferably stainless steel).

In the embodiment example shown in FIG. 4, the directly reflecting (normal-incidence) collector optics 1, as a multilayer mirror 12, is outfitted with a dielectric alternating layer system 14 which is used without an additional dielectric coating as a barrier layer 22 between the back electrode 25 and the grid electrode 26 mounted in front. In the present embodiment example, the grid electrode 26 is arranged parallel opposite to the contaminated optical surface 11 of the multilayer mirror 12. Taking into account its (usually parabolic) curvature, a suitable gas flow is streamed over the mirror surface 11 formed by the multilayer mirror 12 in order to generate the cold plasma 4 similarly as was stated above with reference to FIG. 2 and to bond the debris deposits 5 through gas radicals 41 and remove them, i.e., pump them out as gaseous reaction products 51 by vacuum pumps.

The construction according to FIG. 5 shows an implementation of the invention for a multilayer mirror 12 with a (non-dielectric) alternating layer system 13 (e.g., Mo/Si multilayer mirror) that is typically used for EUV radiation. However, it differs from that shown in FIG. 4 only in the way that the barrier layer 22 is realized.

The dielectric barrier layer 22 to be arranged between the surface electrodes 21 is realized, according to FIG. 5, as a coating 27 of the grid electrode 26 which is constructed as a complete covering of the metal wires of the grid electrode 26. Therefore, the grid electrode 26 is drawn somewhat thicker than in FIG. 4 and can only be discerned as being provided with a coating 27 in the enlarged detail drawing. All other elements and working principles for cleaning the optical surface (mirror surface 11) are the same as those described with reference to FIG. 4.

The cleaning process according to the invention is not limited to the collector optics 1 described in the preceding embodiment examples, but rather can also be applied in an analogous way to other reflecting optics in the beam path of lithographic exposure devices.

While the foregoing description and drawings represent the present invention, it will be obvious to those skilled in the art that various changes may be made therein without departing from the true spirit and scope of the present invention.

REFERENCE NUMBERS 1 collector optics
11 mirror surface (optical surface)
12 multilayer mirror
13 alternating layer system
14 dielectric alternating layer system
2 AC voltage source
21 surface electrode
22 (dielectric) barrier layer
23 center electrode
24 discharge filament
25 back electrode
26 grid electrode
27 (dielectric) coating
3 gas flow
4 cold plasma
41 gas radicals
5 debris particles
51 reaction products

What is claimed is:

1. An arrangement for cleaning optical surfaces of reflection optics which are arranged in a plasma-based radiation source or in an exposure device arranged downstream and which are contaminated by debris particles emitted by a hot plasma of the radiation source, comprising:

gas feeds being arranged at the edge of the optical surfaces for streaming in at least one gas along the optical surfaces, which gas is reactive for the debris particles, and gas radicals can be generated from the introduced gas by electric discharges with the participation of electrode areas that are associated with at least a portion of the optical surface in parallel planes, said gas radicals forming gaseous compounds with debris particles generated by plasma;

vacuum pumps being provided in the radiation source for sucking up these debris particles;

a closed optical surface being formed in each instance either itself as a surface electrode or is provided with a back surface electrode parallel to the optical surface;

a surface electrode that is formed approximately parallel to the optical surface being arranged over the optical surface as a counter-electrode;

at least one dielectric barrier layer being arranged between the surface electrodes over the entire surface of one of the oppositely located surface electrodes; and the oppositely located surface electrodes being connected to an AC voltage source having an AC voltage in the Hz to kHz range so that a cold plasma is generated in the gas flow between the surface electrodes by ongoing dielectrically impeded discharges which are evenly distributed spatially and gas radicals are continuously provided for cleaning the optical surfaces.

2. A method for cleaning optical surfaces of reflection optics, which are arranged in plasma-based radiation sources or exposure devices according to the arrangement of claim 1, comprising the steps of:

guiding at least one gas which is reactive for the debris particles over the optical surface, gas radicals being generated by electrical discharges over the optical surface, debris particles deposited on the optical surface being bonded by the gas radicals to form gaseous reaction products, and the reaction products being carried away from the optical surface by the gas flow;

said gas radicals being generated by dielectrically impeded discharge between two surface electrodes which are arranged along the entire closed optical surface and approximately parallel over the optical surface;

said gas radicals being generated almost exclusively by electron transfer by charge polarization on at least one dielectric barrier layer which covers the entire surface of at least one of the surface electrodes;

applying an AC voltage in the Hz to kHz range to the surface electrodes for periodically eliminating the charge polarization at the barrier layer so that a homogeneous cold plasma is generated continuously from the gas flowing in;

said gas radicals of said homogeneous cold plasma able to absorb substantially no kinetic energy during the discharge; and guiding the cold plasma over the optical surface with the flow of gas without thermal stress or sputtering on the optical surface in order to bond the deposited debris particles and sucking them up through a vacuum system as gaseous reaction products.

3. The method according to claim 2;
wherein the dielectrically impeded discharge is generated between neighboring nested mirror surfaces of collector optics, wherein the barrier layer is arranged in each instance on the non-reflecting outer side of the respective mirror surface, and the discharge is carried out for the innermost mirror surface by means of a center electrode that is coated by a barrier layer.

4. The method according to claim 2;
wherein the dielectrically impeded discharge is generated between a metal back electrode of a multilayer mirror and a grid electrode that is formed parallel over the optical surface, wherein, in case the multilayer mirror has a dielectric alternating layer system, the latter is used as a multilayer barrier layer.

5. The method according to claim 2;
wherein the dielectrically impeded discharge is generated between a metal back electrode of a multilayer mirror and a grid electrode that is formed parallel in front of the latter, wherein the grid electrode is provided with a dielectric coating as barrier layer.

6. The method according to claim 2;
wherein the dielectrically impeded discharge is used for removing from the optical surfaces metallic debris particles from the group of lithium and tin through the introduction of hydrogen.

7. The method according to claim 2;
wherein the dielectrically impeded discharge is used for removing from the optical surfaces metallic debris particles from the group of tungsten and molybdenum through the introduction of fluorine.

8. The arrangement according to claim 1;
wherein the AC voltage source is adjustable to a frequency in the range between 1 Hz and 100 kHz.

9. The arrangement according to claim 1;
wherein adjacent metal mirror surfaces are formed in each instance as surface electrodes in collector optics which are constructed for grazing incidence and which have nested mirror surfaces, these surface electrodes being connected to different poles of the AC voltage source, wherein the barrier layer is arranged on the non-reflecting rear side of the respective mirror surface and a center electrode coated with a barrier layer is provided for the innermost mirror surface.

10. The arrangement according to claim 9;
wherein the nested mirror surfaces serving as oppositely located surface electrodes and the center electrode are connected alternately from the outside inward to different poles of the same AC voltage source.

11. The arrangement according to claim 9;
wherein the nested mirror surfaces serving as oppositely located surface electrodes and the center electrode are connected alternately from the outside inward to different AC voltage sources.

12. The arrangement according to claim 9;
wherein the AC voltage applied to the surface electrodes is between 10 V and 10 kV depending on the spacing of the mirror surfaces and the characteristics of the barrier layer.

13. The arrangement according to claim 1;
wherein the thickness of the barrier layer is less than 5 mm.

14. The arrangement according to claim 1;
wherein the barrier layer is made of ceramic or glass.

15. The arrangement according to claim 1;
wherein the barrier layer is made of plastic.

16. The arrangement according to claim 1;
wherein a metal back electrode and a grid electrode which is formed parallel to the optical surface and arranged at a defined distance in front of the latter are connected to the AC voltage source as surface electrodes in collector optics which are formed as a multilayer mirror for normal incidence.

17. The arrangement according to claim 16;
wherein the grid electrode is constructed as a thin wire grid with a mesh opening that is one tenth of the distance to the back electrode and with a wire cross section of less than 1 mm.

18. The arrangement according to claim 16;
wherein the grid electrode is made of one of the metals sliver, copper, gold, or stainless steel.

19. The arrangement according to claim 16;
wherein the grid electrode is provided with a dielectric coating over its entire surface as a barrier layer.

20. The arrangement according to claim 16;
wherein the mirror surface of the multilayer mirror is constructed as a dielectric alternating layer system and is used as a barrier layer.

21. The arrangement according to claim 16;
wherein in the absence of a dielectric alternating layer system the mirror surface of the multilayer mirror is provided with a dielectric cover layer that is transparent to EUV radiation as barrier layer.

* * * * *